United States Patent [19]

Armstrong

[11] Patent Number: 4,496,311

[45] Date of Patent: Jan. 29, 1985

[54] MULTILAMP PHOTOFLASH ARRAY FABRICATION

[75] Inventor: Donald E. Armstrong, Williamsport, Pa.

[73] Assignee: GTE Products Corporation, Stamford, Conn.

[21] Appl. No.: 607,030

[22] Filed: May 4, 1984

Related U.S. Application Data

[62] Division of Ser. No. 359,467, Mar. 18, 1982.

[51] Int. Cl.³ ............................................... F21K 5/00
[52] U.S. Cl. ..................................... 431/359; 362/11; 362/15
[58] Field of Search ............... 431/359; 362/11, 13–15

[56] References Cited

U.S. PATENT DOCUMENTS

| | | | |
|---|---|---|---|
| 4,334,262 | 6/1982 | Latos | 362/13 |
| 4,397,803 | 8/1983 | Hall et al. | 362/13 |
| 4,420,301 | 12/1983 | Shaffer | 431/359 |
| 4,427,368 | 1/1984 | Brower | 362/15 |

Primary Examiner—Carroll B. Dority, Jr.
Attorney, Agent, or Firm—Thomas H. Buffton

[57] ABSTRACT

A multilamp photoflash array and fabrication process is provided wherein electrically conductive leads of a plurality of flashlamps are embedded in and wrapped about the ends of a plastic reflector unit which is, in turn, affixed to a circuit board to provide contact between the bent leads and a printed circuit on the circuit board.

5 Claims, 7 Drawing Figures

MULTILAMP PHOTOFLASH ARRAY FABRICATION

CROSS REFERENCE TO OTHER APPLICATIONS

This is a division of application Ser. No. 359,467, filed Mar. 1, 1982.

A concurrently filed application, bearing U.S. Ser. No. 359,468, entitled "Subminiature Photoflash Array," filed in the names of John W. Shaffer and David W. Mecone and assigned to the assignee of the present application, relates to an open-backed reflector unit for securing loads of a plurality of flashlamps. Another concurrently filed application, bearing U.S. Ser. No. 359,465, entitled "Subminiature Array With Retaining Reflector," filed in the name of Boyd G. Brower and assigned to the assignee of the present application, relates to an array having a retaining member for affixing photoflash lamp leads and a sonic member for enchanced insulation.

TECHNICAL FIELD

This invention relates to multilamp photoflash arrays and more particularly to an improved array and process for fabricating multilamp photoflash arrays.

BACKGROUND ART

Generally, multilamp photoflash arrays include a circuit board having a printed circuit thereon and a plurality of flashlamps each having a pair of electrically conductive leads extending outwardy thereform. These electrically conductive leads are connected to the printed circuit by any one of a number of well known techniques. For example, eyelets may be inserted in the circuit board and the lamp leads crimped therein, the leads may be looped through holes in the circuit board, or the leads may be staked through the circuit board and into the back of the circuit runs of the printed circuit. Also, it is common in low voltage arrays to solder the electrically conductive leads to the circuit runs of the printed circuit.

Although the above-described techniques for fabricating multilamp photoflash arrays have been and still are used with varying degrees of success, it has been found that such techniques do have limitations and especially so in the manufacture of miniature and subminiature photoflash assemblies. More specifically, component and assembly costs as well as space limitations render the above-described techniques of array assembly and electrical lead attachment unsatisfactory for miniaturized arrays.

One known form of miniaturized array having an enhanced attachment of the leads to a printed circuit is disclosed in a concurrently filed application entitled "Subminiature Photoflash Array," bearing U.S. Ser. No. 359,468 filed in the names of Shaffer et al. and assigned to the assignee of the present application. Therein, the electrically conductive leads of the flashlamps are passed through small apertures in a reflector unit, bent to hold the lamps within the reflector unit and the reflector unit is sealed to a circuit board in a manner to cause the bent leads to contact the printed circuit on the circuit board.

Although the above-described configuration does provide numerous advantages over the previously described eyelet crimping, staking and soldering structures and fabrications techniques, it has been found that a problem does exist. Specifically, it has been found deleterious to assembly time and cost when relatively small wires are passed through relatively small holes as set forth in the above discussed application.

OBJECTS AND SUMMARY OF THE INVENTION

An object of the present invention is to provide an improved multilamp photoflash array.

Another object of the invention is to provide an enhanced process for fabricating multilamp photoflash arrays.

Still another object of the invention is to improve the attachment capabilities between the electrical conductive leads of a flashlamp and a printed circuit in a multilamp photoflash array.

A further object of the invention is to reduce the cost and improve the efficiency of fabricating a multilamp photoflash array.

These and other objects, advantages and capabilities are achieved in one aspect of the invention by a multilamp photoflash array fabricating process wherein flashlamps having electrically conductive leads are positioned on a side of a reflector unit opposite from the side thereof having lamp receiving cavities, heat is applied to the leads in an amount sufficient to cause the leads to melt said reflector unit, contact between the leads and reflector unit is effected to cue the leads to pass through the reflector unit, the reflector unit and lead are cooled to embed the leads in the reflector unit, the leads are bent about the reflector unit to position the lamps within the lamp-receiving cavities and the reflector unit is sealed to a printed circuit board.

BEST MODE FOR CARRYING OUT THE INVENTION

For a better understanding of the present invention, together with other and further objects, advantages and capabilities thereof, reference is made to the following disclosure and appended claims in conjunction with the accompanying drawings.

Figure 1:
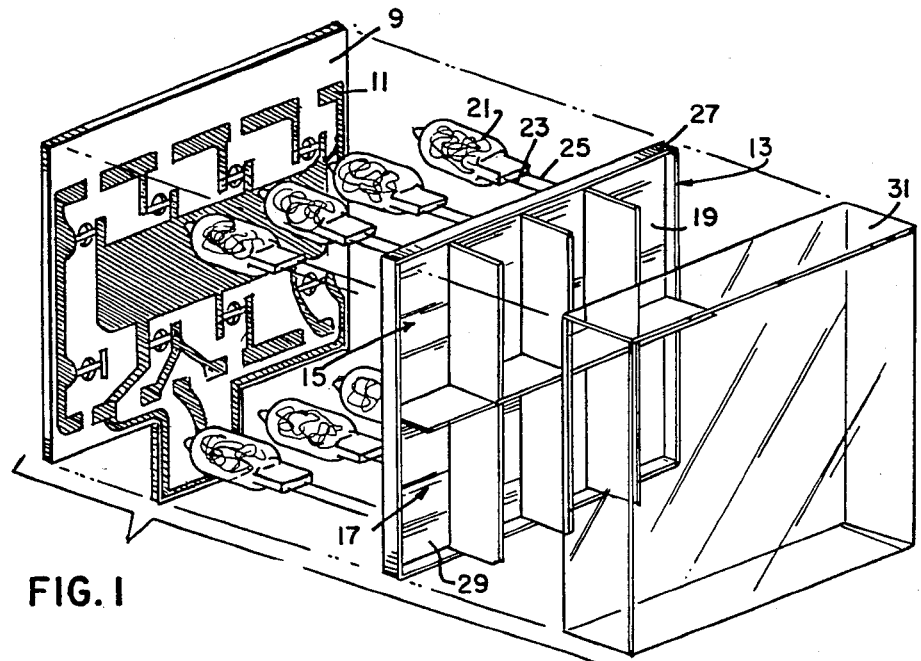
FIG. 1 is an isometric exploded view of a preferred form of multilamp photoflash array.
Figure 2:
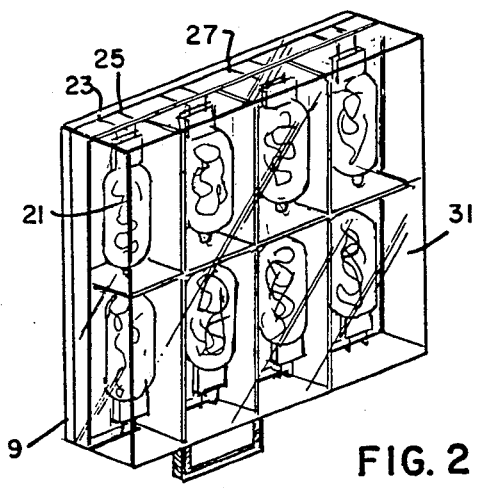
FIG. 2 is an assembled view of the array of FIG. 1.

Referring to the drawings, FIGS. 1 and 2 illustrate a preferred form of miniaturized multilamp photoflash array. Therein, a circuit board 9 has a printed circuit 11 located on an inner surface thereof. A plastic reflector unit 13 includes first and second rows 15 and 17 of a plurality of lamp-receiving cavities 19. A plurality of photoflash lamps 21 each have a pair of electrically conductive leads 23 and 25 which are passed through and embedded in the plastic reflector unit 13. These electrically conductive leads 23 and 25 are preferably bent about 270° around the ends 27 and 29 of the reflector unit 13 and nested in the cavities 19.

With the photoflash lamps 21 nested within the cavities 19, the plastic reflector unit 13 is sealed, by heat or ultrasonics for example, to the circuit board 9. Moreover, a light transmittable cover member 31 may be telescoped over the reflector unit 13 and photoflash lamps 21 and affixed to the circuit board 9. Thus, an array includes a circuit board 9 having a printed circuit 11 thereon with a plastic reflector unit 13 having cavities 19 wherein are nested photoflash lamps 21. Moreover, the lamps 21 have electrically conductive leads 23 and 25 which are wrapped about the ends 27 and 29 thereof with the leads 23 and 25 contacting the printed circuit 11. Moreover, the reflector unit 13 is affixed to the circuit board 9 and a cover 31 envelopes the lamps 21, reflector unit 13 and printed circuit and is sealed to the circuit board 9.

Figure 3:
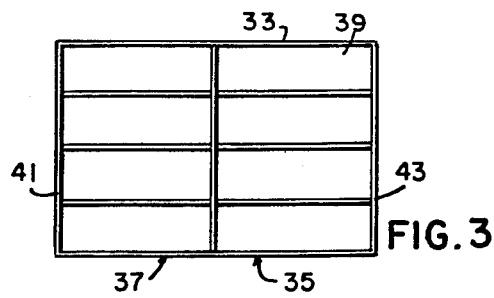
FIGS. 3–7 are progressive diagrammatic illustrations of a preferred process for fabricating the array of FIG. 1.

As to fabrication of the above mentioned miniaturized multilamp photoflash array, reference is made to the diagrammatic illustration of FIGS. 3 through 7. FIG. 3 illustrates a plastic reflector unit 33 having first and second rows 35 and 37 of a plurality of cavities 39. Also, these first and second rows 35 and 37 of cavities 39 each have an end 41 and 43 respectively.

Figure 4:
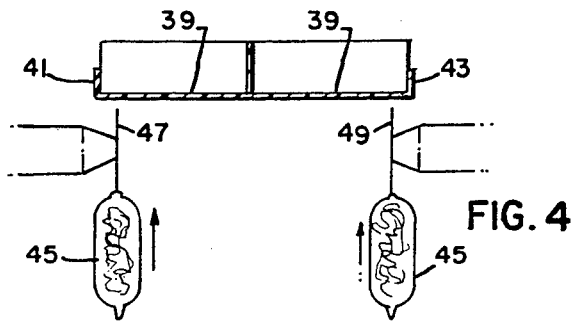

The reflector unit 33 is positioned with the cavities 39 faced in an upward direction and flashlamps 45 each having a pair of electrically conductive leads 47 and 49 are positioned below the reflector unit 33 with the leads 47 and 49 extending outwardly from the flashlamps 45 and upwardly toward the reflector unit 33 as can be seen in FIG. 4.

Figure 5:
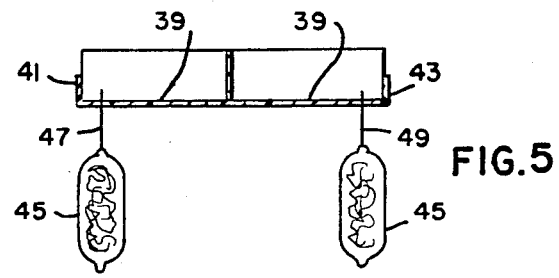
Figure 6:
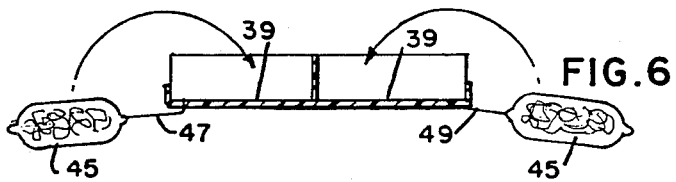
Figure 7:
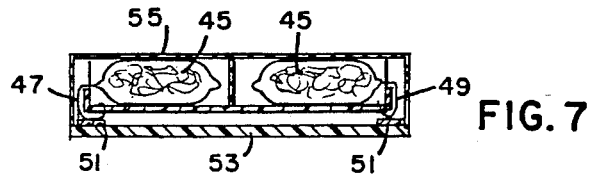

Thereafter, the electrically conductive leads 47 and 49 are heated in an amount and to a temperature sufficient to cause melting of the plastic reflector unit 33 upon contact therewith. For example, the plastic of the reflector unit 33 may be a well known polystyrene material having a melting temperature of about 170° F. and a deformation temperature of about 140° F. Thus, the conductive leads 47 and 49 are heated above the melting temperature of the plastic reflector unit 33 and placed in contact therewith whereupon the conductive leads 47 and 49 pass through the reflector unit 33 as can be seen in the illustration of FIG. 5.

Following, the plastic reflector unit 33 and electrically conductive leads 47 and 49 are cooled to cause the leads 47 and 49 to become embedded in the plastic reflector unit 33. Then, the conductive leads 47 and 49 are wrapped about the ends 41 and 43 of the reflector unit 33 and the lamp 45 nested within the cavities 39. As can be more clearly seen in FIG. 7, the conductive leads 47 and 49 are circularly bent at a preferred angle of about 270° such that the lamps 45 rest within the cavities 39. Moreover, the bent conductive leads 47 and 49 are positioned to make contact with a portion of the printed circuit 51 located on the inner surface of a circuit board 53 when the reflector unit 33 is affixed to the circuit board 53.

Additionally, the bent electrically conductive leads 47 and 49 are positioned to make contact with portions of the printed circuit 51 located on the inner surface of the circuit board 53. Moreover, the above-described contact between the conductive leads 47 and 49 and circuit board 53 is established when the reflector unit 33 is affixed to the circuit board 53 by any one of a number of established and well known attachment methods.

Also, a plastic cover member 55 may be, not necessarily need be, telescoped over the flashlamps 45, reflector unit 33 and printed circuit 51 and attached to the circuit board 53.

While there has been shown and described what is at present considered the preferred embodiments of the invention, it will be obvious to those skilled in the art that various changes and modifications may be made therein without departing from the invention as defined by the appended claims.

INDUSTRIAL APPLICABILITY

An enhanced miniaturized multilamp photoflash array and fabrication process have been provided wherein a pair of electrically conductive leads of each photoflash lamp are passed through, embedded into and wrapped around the ends of a reflector unit. The structure utilizes a process for positioning the leads and contacting a printed circuit with the leads formed such that expensive connectors are not required. Thus, the array as well as the fabrication process are inexpensive of both labor and materials.

I claim:

1. A miniaturized multilamp photoflash array comprising a circuit board having a printed circuit on the inner surface thereof, a reflector unit affixed to said circuit board and having a plurality of cavities, a plurality of photoflash lamps with each lamp disposed within a cavity and a transparent cover member telescoped over said photoflash lamps, reflector unit and printed circuit and affixed to said circuit board, said array characterized by the improvement wherein each of said lamps includes a pair of electrically conductive leads passing through, embedded in and wrapped about one of the ends of said reflector unit whereby each of said lamps is nested within a cavity of said reflector unit.

2. The miniaturized mutlilamp photoflash array of claim 1 wherein said electrically conductive leads of each of said photoflash lamps passing through, embedded in and wrapped about the ends of said reflector unit are in contact with said printed circuit on said inner surface of said circuit board.

3. The miniaturized multilamp photoflash array of claim 1 wherein said reflector unit includes two rows of a plurality of cavities each having an end portion and two rows of a plurality of photoflash lamps each having a pair of electrically conductive leads embedded in said reflector unit and wrapped about an end portion of said reflector unit to position said photoflash lamp within a cavity of said reflector unit.

4. The miniaturized multilamp photoflash array of claim 1 wherein said electrically conductive leads of each of said photoflash lamps exhibits a circular bend of about 270°.

5. The miniaturized multilamp photoflash array of claim 1 wherein said reflector unit includes two rows of multiple cavities.

* * * * *